(12) United States Patent
Welty (10) Patent No.: US 7,498,587 B2
(45) Date of Patent: Mar. 3, 2009

(54) BI-DIRECTIONAL FILTERED ARC PLASMA SOURCE

(75) Inventor: Richard P. Welty, Boulder, CO (US)

(73) Assignee: Vapor Technologies, Inc., Longmont, CO (US)

( * ) Notice: Subject to any disclaimer, the term of this patent is extended or adjusted under 35 U.S.C. 154(b) by 417 days.

(21) Appl. No.: 11/415,369

(22) Filed: May 1, 2006

(65) Prior Publication Data

US 2007/0251816 A1 Nov. 1, 2007

(51) Int. Cl.
H01J 27/00 (2006.01)

(52) U.S. Cl. .............................. 250/423 R; 204/192.38; 204/298.16; 204/298.41; 204/192.12; 204/192.13; 204/298.14; 204/298.17; 204/298.02; 204/298.11; 118/723 VE; 315/111.21; 315/111.41; 315/111.81

(58) Field of Classification Search ............. 250/423 R; 204/192.38, 298.16, 298.41, 192.12, 192.13, 204/298.08, 298.14, 298.17, 298.02, 298.11; 118/723 VE; 315/111.21, 111.41, 111.81
See application file for complete search history.

(56) References Cited

U.S. PATENT DOCUMENTS

| | | | |
|---|---|---|---|
| 3,783,231 A | 1/1974 | Sabtev et al. | |
| 3,793,179 A | 2/1974 | Sabtev et al. | |
| 4,031,424 A | 6/1977 | Penfold et al. | |
| 4,116,806 A | 9/1978 | Love et al. | |
| 4,194,962 A | 3/1980 | Chambers et al. | |
| 4,404,077 A | 9/1983 | Fournier | |
| 4,428,259 A | 1/1984 | Kubo et al. | |
| 4,430,184 A | 2/1984 | Mularie | |
| 4,448,659 A | 5/1984 | Morrison, Jr. | |
| 4,452,686 A | 6/1984 | Axenov et al. | |
| 4,486,289 A | 12/1984 | Parsons et al. | |
| 4,492,845 A | 1/1985 | Kluchko et al. | |
| 4,515,675 A | 5/1985 | Kieser et al. | |
| 4,559,121 A | 12/1985 | Mularie | |
| 4,581,118 A | 4/1986 | Class et al. | |
| 4,600,489 A | 7/1986 | Lefkow | |
| 4,717,968 A | 1/1988 | Painton et al. | |

(Continued)

OTHER PUBLICATIONS

Aksenov et al., Transport of Plasma Streams in a Curvilinear Plasma-Optics System, 1979 American Institute of Physics, Sov. J. Plasma Phys. 4(4), Jul.-Aug. 1978, 4 pages.

*Primary Examiner*—Jack I Berman
*Assistant Examiner*—Meenakshi S Sahu
(74) *Attorney, Agent, or Firm*—Foley & Lardner LLP (57) ABSTRACT

An apparatus for generating plasma includes a cathode having an evaporable surface configured to emit a material comprising plasma and macroparticles; oppositely directed output apertures configured to direct the plasma; a filter configured to transmit at least some of the plasma to the output apertures while preventing transmission of at least some of the macroparticles, the filter comprising at least one deflection electrode disposed generally parallel to and facing at least a portion of the evaporable surface; a first element for generating a first magnetic field component having a first polarity between the cathode and the at least one deflection electrode; and a second element for generating a second magnetic field component having a second polarity at the evaporable surface of the cathode that is opposite that of the first polarity such that a low-field region is created between the evaporable surface and the at least one deflection electrode.

35 Claims, 6 Drawing Sheets

U.S. PATENT DOCUMENTS

| | | |
|---|---|---|
| 4,749,587 A | 6/1988 | Bergmann et al. |
| 4,801,217 A | 1/1989 | Goldberg |
| 4,812,217 A | 3/1989 | George et al. |
| 4,849,088 A | 7/1989 | Veltrop et al. |
| 4,933,064 A | 6/1990 | Geisler et al. |
| 4,994,164 A | 2/1991 | Bernardet et al. |
| 5,133,850 A | 7/1992 | Kukla et al. |
| 5,160,585 A | 11/1992 | Berg |
| 5,262,028 A | 11/1993 | Manley |
| 5,266,178 A | 11/1993 | Sichmann |
| 5,269,898 A | 12/1993 | Welty |
| 5,277,778 A | 1/1994 | Daube et al. |
| 5,277,779 A | 1/1994 | Henshaw |
| 5,279,723 A | 1/1994 | Falabella et al. |
| 5,282,944 A | 2/1994 | Sanders et al. |
| 5,317,235 A | 5/1994 | Treglio |
| 5,364,518 A | 11/1994 | Hartig et al. |
| 5,380,421 A | 1/1995 | Gorokhovsky |
| 5,387,326 A | 2/1995 | Buhl et al. |
| 5,403,457 A | 4/1995 | Nago et al. |
| 5,404,017 A | 4/1995 | Inuishi et al. |
| 5,433,836 A | 7/1995 | Martin et al. |
| 5,435,900 A | 7/1995 | Gorokhovsky |
| 5,451,308 A | 9/1995 | Sabtev et al. |
| 5,480,527 A | 1/1996 | Welty |
| 5,482,611 A | 1/1996 | Helmer et al. |
| 5,512,156 A | 4/1996 | Yamanishi et al. |
| 5,518,597 A | 5/1996 | Storer et al. |
| 5,531,877 A | 7/1996 | Latz et al. |
| 5,587,207 A | 12/1996 | Gorokhovsky |
| 5,589,039 A | 12/1996 | Hsu |
| 5,597,459 A | 1/1997 | Altshuler |
| 5,730,847 A | 3/1998 | Hanaguri et al. |
| 5,804,041 A | 9/1998 | Hurwitt |
| 5,840,163 A | 11/1998 | Welty |
| 5,997,705 A * | 12/1999 | Welty .................... 204/298.41 |
| 6,756,596 B2 | 6/2004 | Sathrum |
| 7,381,311 B2 * | 6/2008 | Aksenov et al. ........ 204/192.38 |

* cited by examiner

BI-DIRECTIONAL FILTERED ARC PLASMA SOURCE

BACKGROUND

The present invention relates generally to a vapor deposition apparatus for depositing a coating on a substrate and methods for depositing a coating on a substrate. More particularly, it relates to a cathodic arc deposition apparatus and methods for using the same.

Cathodic arc evaporation has during the last two decades come into wide commercial use for depositing coatings of metals, metal alloys and compounds, and carbon. Cathodic arc discharges can also be used as plasma sources for ion processing operations such as implantation, sputter etching, reactive etching, and diffusion. A cathode of the desired material (or its precursor) is vaporized by a high current, low voltage arc plasma discharge in a vacuum chamber which has been evacuated to a pressure of typically less than 0.001 mbar. Typical arc currents range between 25 and 1000 amperes, with voltages between 15 and 50 volts. Compounds such as metal nitrides, carbides, and oxides may be formed by the introduction of one or more reactive gasses during deposition.

An undesirable side effect of cathodic arc evaporation is the generation of molten droplets of cathode material, which are ejected from the cathode by the reaction force of the arc jet. These droplets are commonly called macroparticles, and range in diameter from sub-micron to tens of microns or more. The macroparticles can become embedded in the coating when they land on the substrate, or can stick and later fall off, causing surface defects in either case.

Strategies for reducing the number of macroparticles reaching the substrate fall generally into two categories. The first strategy is to use a magnetic field at the target surface to accelerate the arc and thereby reduce the generation of macroparticles. The second strategy is to interpose a filter or similar structure between the cathode and the substrates. The filter allows at least part of the ionized vapor to be transmitted while blocking at least some of the molten droplets. The first strategy (i.e., the employment of a magnetic field) is generally simpler to implement but does not completely eliminate macroparticle generation. The second strategy (i.e., filtering) is generally more effective at reducing macroparticle contamination of the coating, but requires a more complex apparatus and has in the past tended to reduce the ion output significantly due to transmission losses.

Filtered arc sources have been described in scientific and patent literature. For example, a publication by Aksenov, et al. ("Transport of plasma streams in a curvilinear plasma-optics system", Soviet Journal of Plasma Physics, 4(4), 1978) was among the first to describe the use of a quarter-toroidal plasma duct, with electromagnet coils to create a solenoidal magnetic field through the duct.

Although circular filtered arc plasma sources are most common, rectangular filtered arc plasma sources are particularly desirable for the coating or ion processing of large substrates, sheet material in roll form, and for quantities of smaller substrates on a linear conveyor or circular carousel.

It would be desirable to provide an improved filtered arc plasma source having substantially higher ion output current than that of known plasma sources. It would also be desirable to provide a method for using a filtered arc plasma source that results in improved deposition as compared to known methods. Accordingly, it would be advantageous to provide a system and/or method that provides any one or more of these or other advantageous features as will become apparent to those reviewing the present disclosure.

SUMMARY

An exemplary embodiment of the invention relates to an apparatus for generating plasma. The apparatus includes a cathode having an evaporable surface configured to emit a material comprising plasma and macroparticles and oppositely directed output apertures configured to direct the plasma. The apparatus also includes a filter configured to transmit at least some of the plasma to the output apertures while preventing transmission of at least some of the macroparticles. The filter comprising at least one deflection electrode disposed generally parallel to and facing at least a portion of the evaporable surface. The apparatus also includes a first element for generating a first magnetic field component having a first polarity between the cathode and the at least one deflection electrode and a second element for generating a second magnetic field component having a second polarity at the evaporable surface of the cathode that is opposite that of the first polarity such that a low-field region is created between the evaporable surface and the at least one deflection electrode.

Another exemplary embodiment of the invention relates to an apparatus for generating plasma that includes a cathode configured to emit plasma and macroparticles and a filter configured to transmit at least a portion of the plasma while preventing transmission of at least a portion of the macroparticles. The filter comprises at least one deflection electrode. The apparatus also includes means for generating a first magnetic field component having a first polarity between the cathode and the at least one deflection electrode and means for generating a second magnetic field component having a second polarity proximate the cathode that is opposite that of the first polarity.

Another exemplary embodiment of the invention relates to a method for generating plasma comprising ionized vapor of a cathode material. The method includes providing a filter comprising parallel deflection electrodes and cathode side shields and providing a cathode configured to eject plasma and macroparticles within the filter. The method also includes generating a primary magnetic field component between the deflection electrodes that is parallel to the deflection electrodes and to an evaporable surface of the cathode. The primary magnetic field intended to increase the transmission of plasma emitted from the evaporable surface to a region outside the deflection electrodes. The method further includes generating a secondary magnetic field component proximate the evaporable surface of the cathode having a polarity opposite that of the primary magnetic field component such that a low-field region is created between the evaporable surface and the adjacent deflection electrode on each side.

DETAILED DESCRIPTION

According to an exemplary embodiment, a bi-directional filtered arc plasma system (i.e., which include sources providing plasma output in two opposite directions) is provided for forming a coating or performing ion processing of a substrate or article. It is intended that the use of such a system will allow the area over which the emitted plasma is distributed to be increased and may also result in increased substrate capacity.

It should be noted that the terms "substrate" and "article" as used herein are intended to refer to any item, structure, or product on which it would be desirable to provide a coating or perform ion processing. Examples of such products include, but are not necessarily limited to, plumbing components (e.g., faucets, handles, nozzles, sinks, drain flanges, stop valves, pipes, tub drains, etc.), home hardware (e.g., doorknobs, hinges, drawer/cabinet pulls, etc.), bath hardware (towel bars, safety "grab" bars, etc.), windows and doors (e.g., shower doors, etc.), automotive products (e.g., automotive trim parts, emblems, wheel covers, etc.), knives, medical instruments, tableware, recreational products, sporting goods (e.g., golf clubs, ice skates, etc.), indoor or outdoor lighting products (e.g., lamps, fixtures, etc.) weatherproof informational signs, and any of a variety of other products or articles.

Figure 1:
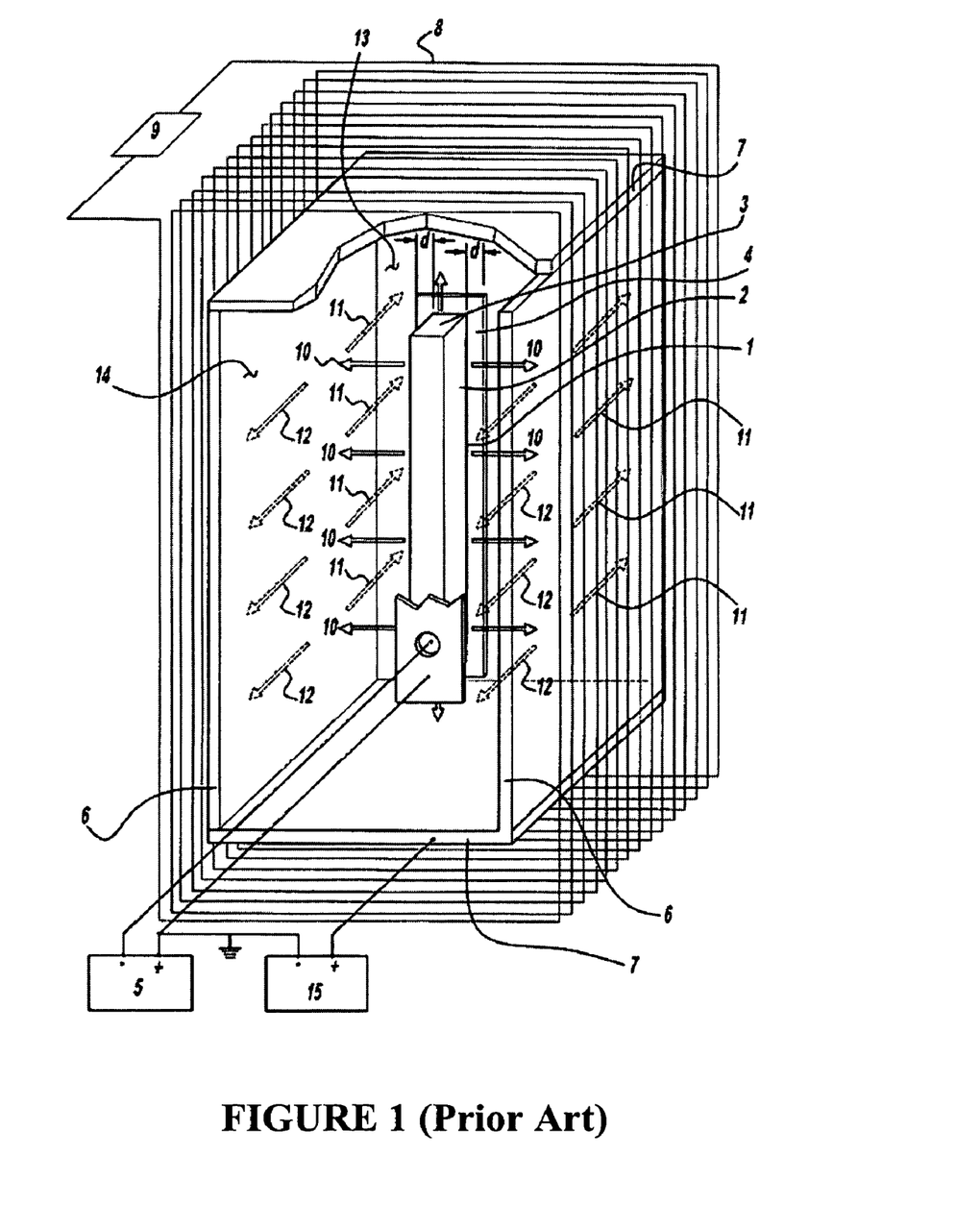
FIG. 1 is a schematic drawing of a prior art filtered arc plasma source illustrating arc, deflector bias, and magnet power supply connections.

FIG. 1 is a schematic drawing of a rectangular filtered arc plasma source such as that described in more detail in U.S. Pat. No. 5,997,705 to Welty and entitled "Rectangular Filtered Arc Plasma Source" (hereinafter referred to as "the '705 patent"), the entire disclosure of which is incorporated herein by reference.

A cathode 1 is provided that includes an evaporable surface wrapping around the periphery consisting of a long side 2, end 3, and their opposite surfaces. During operation, arc spots circulate around the periphery in a continuous "racetrack" circuit, at a speed determined by the cathode material and the strength of the magnetic field component parallel to the cathode surface. Plasma is emitted from the cathode in directions approximately perpendicular to all four faces of the periphery (evaporable surface). For a long cathode, most of the plasma is emitted in two opposing directions perpendicular to the long sides of the cathode.

Macroparticles ejected from the evaporable surface are prevented from reaching the substrate by a filtering apparatus comprising cathode side shields and deflection electrodes. Cathode side shields 4 are disposed perpendicular to the evaporable surface along both edges, and project a distance "d" outward from the evaporable surface all around. Arc power supply 5 is connected at its negative terminal to cathode 1 and at its positive terminal to side shield 4 (which also serves as an anode).

Figure 2:
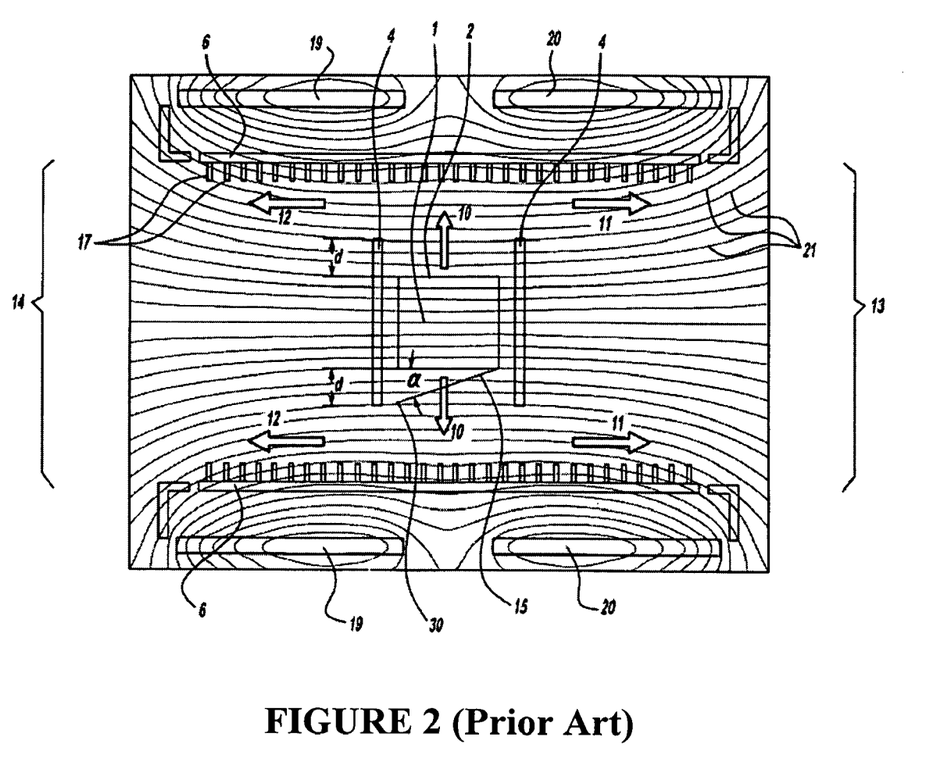
FIG. 2 is a schematic cross-sectional drawing of the filtered arc plasma source shown in FIG. 1 illustrating magnetic flux lines and macroparticle trajectories.

The anode of the discharge may comprise an electrically isolated structure within the vacuum chamber or may comprise one or more structures electrically grounded to the (metal) vacuum chamber or system ground. The anode must be in electrical contact with the plasma (i.e., impinged upon by a sufficient number of plasma particles to support the discharge) and is preferably a surface through which at least some of the magnetic flux lines parallel to the deflection electrodes pass. As shown in FIG. 2, which is a cross-sectional view of the filtered arc source shown in FIG. 1, the anode comprises side shields 4, which are connected to the positive output of the arc power supply and may preferably also be connected to the system ground.

As shown in FIG. 1, side deflection electrodes 6 are disposed parallel to the sides of the cathode 1 and facing the evaporable surfaces. End deflection electrodes 7 may also be disposed parallel to the ends of the cathode to reduce end losses. An electromagnet coil 8 is disposed around the outside of the deflection electrodes 6 and 7 and is connected to a coil power supply 9. The coil is aligned such that the solenoidal magnetic field generated is substantially parallel to all four faces of the evaporable surface and to the deflection electrodes. The apparatus may be operated such that the coil current, and hence the magnetic field, is provided in either polarity.

The deflection electrodes 6 and 7 may be connected to the positive output of a deflection bias supply 15, the negative output of which is connected to the anode (side shield anode 4). Arrows 10 indicate the general direction of the plasma flow as it is emitted approximately perpendicular to the evaporable surface (i.e., in an angular distribution falling off as the angle away from the surface normal increases). Arrows 11 and 12 indicate the oppositely-directed streams into which the plasma is split as it is redirected by deflection electrodes 6. Plasma streams 11 and 12 exit the source through oppositely facing output apertures 13 and 14.

The deflection electrodes 6 and 7 have a selected width and are mounted at a selected distance from the evaporable surface. The deflection electrodes function to deflect and redirect the plasma stream, emitted perpendicular to the evaporable surface, into two opposite directions parallel to the electrodes and the evaporable surface. The deflection electrodes also function to block macroparticles ejected at high angles to the evaporable surface. The width of the deflection electrodes and their distance from the evaporable surface, as well as the distance by which the side shields project outward from the evaporable surface, are selected such that there is no line of sight from the evaporable surface to the substrate. In this case a macroparticle ejected from any point on the evaporable surface and traveling in any direction toward the substrate will be blocked by either a cathode side shield or a deflection electrode.

Baffles 17 may be disposed perpendicular to electrodes 6 to reduce bouncing of macroparticles toward the output apertures 13 and 14. Arrow 15 shows a trajectory for a macroparticle 30 emitted at angle α from evaporable surface 2. Macroparticles emitted below angle α are blocked by side shields 4, while those above angle α are blocked by deflection electrodes 6.

As shown in FIG. 2, electromagnet coils 19 and 20 are disposed around the outside of deflection electrodes 6. Magnetic flux lines 21 generated by current in coils 19 and 20 are substantially parallel to evaporable surface faces 2, and to deflection electrodes 6 and 7. According to an exemplary embodiment, the shape and location of coils 19 and 20 were chosen using computer modeling to provide the desired magnetic field shape for the particular electrode geometry shown. The magnetic flux lines shown in FIGS. 2 and 3 were generated by a commercially available finite element magnetic analysis program (e.g., commercially available under the name "Maxwell" from Ansoft Corporation of Pittsburgh, Pa.). For coils 19 and 20 carrying a current density of 1000 amperes/cm$^2$ and having relative dimensions as shown with respect to the electrodes (independent of actual scale) the field strength in the region adjacent to evaporable surfaces 2 is about 25 gauss.

One concern associated with the apparatus shown and described with respect to FIG. 1 is that to achieve efficient deflection of the plasma, and hence higher source output, it is desirable to have a strong magnetic field near the deflection electrode. Since the primary magnetic field component generated by the primary magnetic means is substantially uniform within the region between the deflection electrodes and the cathode, a strong magnetic field also then exists at the cathode surface. While a weak magnetic field at the cathode surface is necessary to force circulation of the arc spots around the periphery of the cathode, a strong field parallel to the cathode surface impedes the flow of plasma away from the cathode surface and hence tends to reduce the source output. There is thus no way to balance the competing influences of magnetic field strength on deflection efficiency and on plasma transport away from the cathode.

Figure 3:
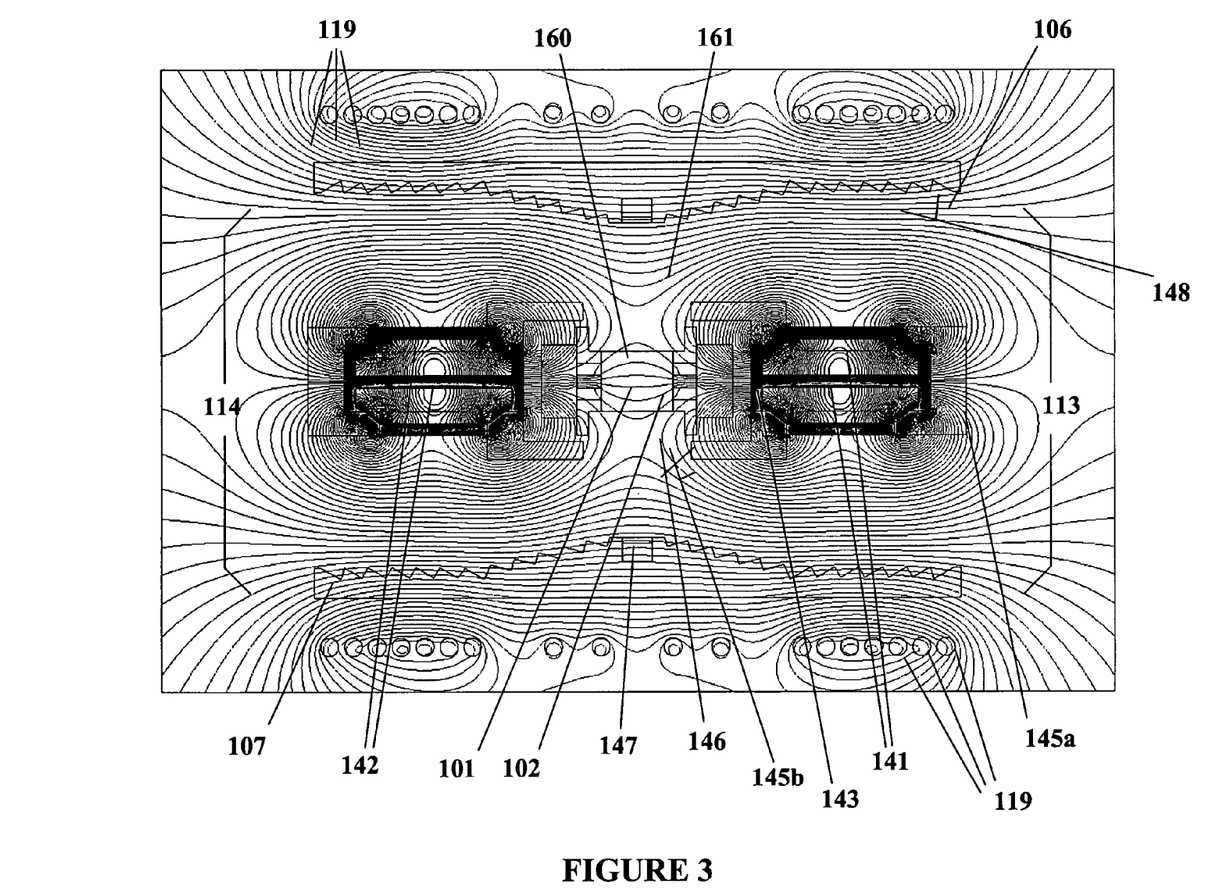
FIG. 3 is a cross-sectional drawing through a filtered arc plasma source according to an exemplary embodiment illustrating magnetic flux lines.

According to an exemplary embodiment illustrated, for example, in FIG. 3, and in contrast to the embodiment shown in FIGS. 1 and 2, instead of a utilizing a single electromagnetic coil 8 to provide the source of the magnetic field, two elements or members (e.g., primary and secondary magnetic means) are used to generate a magnetic field in the region between the deflection electrodes and adjacent to the target surface.

The magnetic field serves both to force arc discharge spots to circulate continuously around the evaporable surface (periphery) of the cathode, and to increase the effectiveness of the deflection electrode as discussed below. The primary magnetic means function to generate a substantially solenoidal primary magnetic field component within the region between the deflection electrodes and throughout the cathode volume, as taught in the '705 patent and shown in FIGS. 1 and 2.

The secondary magnetic means functions to generate a secondary magnetic field component concentrated near the cathode surface, having polarity opposite the primary magnetic field component, which thereby reduces the total field strength (the sum of the primary and secondary components) in the region near the cathode surface. According to an exemplary embodiment, the secondary magnetic means is preferably located near the cathode, such that the strength of the secondary field component is greater near the cathode surface than near the deflection electrode.

By controlling the relative strengths of the primary and secondary field components, it is possible according to an exemplary embodiment to achieve simultaneously a strong field near the deflection electrode and a weak field near the cathode surface, thereby maximizing the efficiency of both the transport of the plasma away from the cathode surface and its redirection at the deflection electrode. A low-field magnetic region is created in front of the cathode surface through which the plasma emitted from the cathode is guided magnetically toward the deflection electrode.

Redirection of the plasma by the deflection electrodes is accomplished using an electric field perpendicular to the electrode surface. The electric field is of the polarity that repels positive ions from the electrode (i.e., the potential becomes increasingly positive for an ion approaching the electrode). At an electrically isolated deflection electrode, an electric field develops spontaneously due to the different arrival rates of ions and electrons from the impinging plasma. A magnetic field parallel to the electrode surface reduces the electron arrival rate much more than the ion arrival rate (due to the electrons much smaller mass), causing the electrode potential to become more positive and hence more effective at repelling ions. The effectiveness of the deflection electrodes may be further increased by applying a positive bias voltage (with respect to the anode) to at least a portion of each deflection electrode by means of an additional power supply.

FIG. 3 is a cross-sectional view of an exemplary embodiment of the present invention in which a cathode 101, having an evaporable surface 102, is disposed between deflection electrodes 106 and 107, and between secondary electromagnet coils 141 and 142. A primary electromagnet coil 119 is disposed around the outside of deflection electrodes 106 and 107. The shape and location of the turns of coil 119 were chosen by means of computer modeling to provide a substantially uniform primary field component parallel to evaporable surface faces 102 and to deflection electrodes 106 and 107. At 400 amps of current in primary coil 119, the flux density ("strength") of the primary magnetic field component between the deflection electrodes 106 and 107 is approximately 150 Gauss. Secondary coils 141 and 142 each have 500 turns of copper wire, wound on a magnetically permeable pole piece, and potted with epoxy in a water cooled copper housing 145, which also serves as an anode surface (145a) and as a cathode side shield surface (145b) that defines the angle $\alpha$ (see, e.g., FIG. 2) below which macroparticles are blocked.

The flux lines 161 shown in FIG. 3 represent the sum of the primary and secondary magnetic field components generated by a primary coil current of 400 amps and a secondary coil current of 9 amps. A low-field region 160 is created in front of the cathode surface through which the plasma emitted from the cathode 101 is channeled toward the deflection electrode 106 and 107. By controlling the relative strengths of the primary and secondary field components, it is possible to achieve a relatively strong field near the deflection electrodes 106 and 107 and a relatively weak field near the cathode surface, thereby maximizing the efficiency of both the transport of the plasma away from the cathode surface, and its redirection at the deflection electrode.

Figure 4:
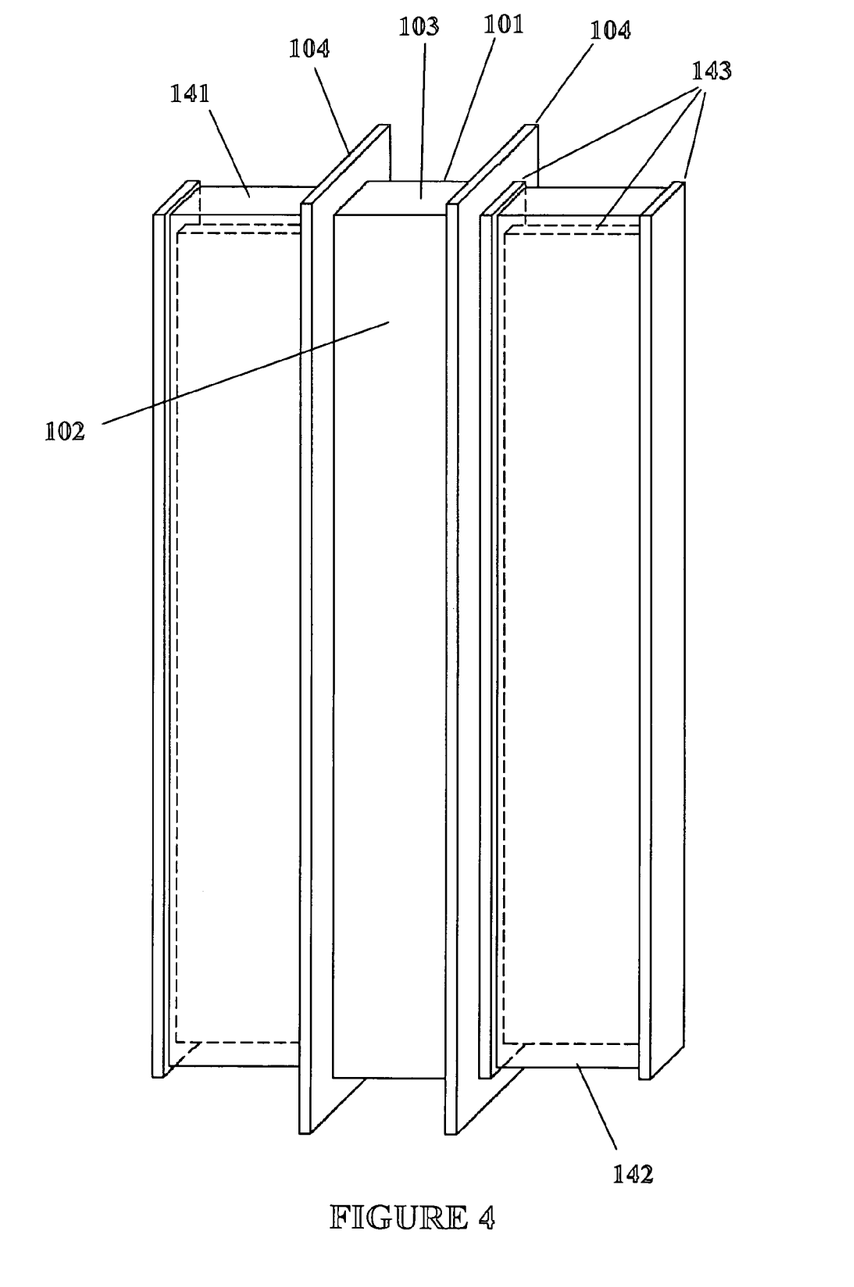
FIG. 4 is a schematic drawing of a linear cathode and secondary magnetic means according to an exemplary embodiment.

FIG. 4 is a schematic drawing of a linear cathode and secondary magnetic means according to an exemplary embodiment in which cathode 101, having an evaporable surface consisting of surfaces 102 and 103 and their corresponding opposite surfaces, is disposed between cathode side shields 104, all of which are disposed between secondary electromagnetic coils 141 and 142. The coils are wound on magnetically permeable pole pieces 143.

Figure 5A:
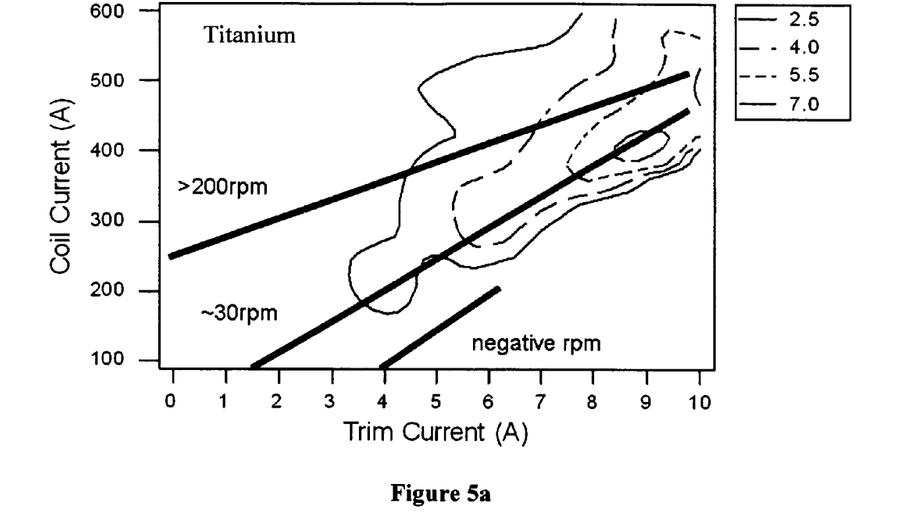
FIGS. 5a and 5b are contour plots of ion current output versus primary and secondary electromagnet coil current, for chromium and graphite cathodes, respectively.
Figure 5B:
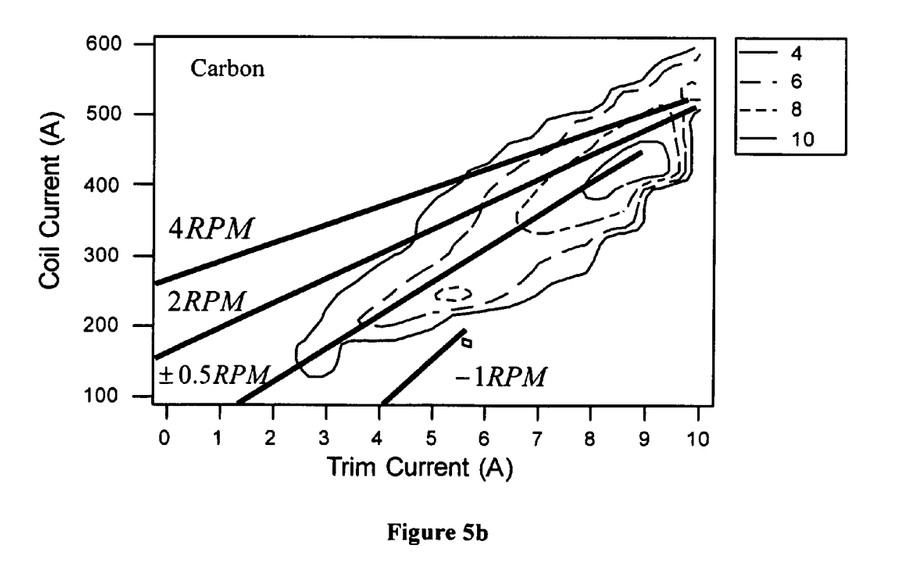

FIGS. 5a and 5b show the average ion output current from the source as the current through the primary and secondary electromagnet coils is varied, and also show the speed at which the arc spots circulate or "rotate" around the cathode. The values for zero secondary coil current correspond to those of the source described in the '705 patent, which includes only a primary electromagnet coil. As the secondary coil current is increased, the magnetic field at the cathode surface becomes weaker, resulting in increasing ion output current and decreasing arc rotation speed. The maximum ion output current occurs as the arc rotation speed nears zero (i.e., the primary magnetic field component at the cathode surface has been almost entirely cancelled by the secondary field component, thus reducing the force driving arc spot circulation). A low-field region 160 is created in front of the cathode surface through which the plasma emitted from the cathode is guided magnetically toward the deflection electrode, where it encounters strong flux lines 161 parallel to the deflection electrodes 106 and 107. At even higher values of secondary coil current, the arc rotation slows completely to a stop and reverses direction, indicated by negative values of the rotation speed.

In the case of carbon, as shown in FIG. 5b, the arc rotation speed is very low—particularly for the high secondary coil current that maximizes the output current. In this case it may become difficult to deposit a coating of uniform thickness onto large substrate areas. According to an exemplary embodiment, it is possible to obtain uniform coatings of amorphous diamond (tetrahedrally bonded amorphous carbon) at a relatively high deposition rate over an area larger than one square meter ($m^2$), by mounting the substrates inside a cylindrical carousel that rotates at a relatively high speed around the arc source, as shown in FIG. 6 according to an exemplary embodiment.

Figure 6:
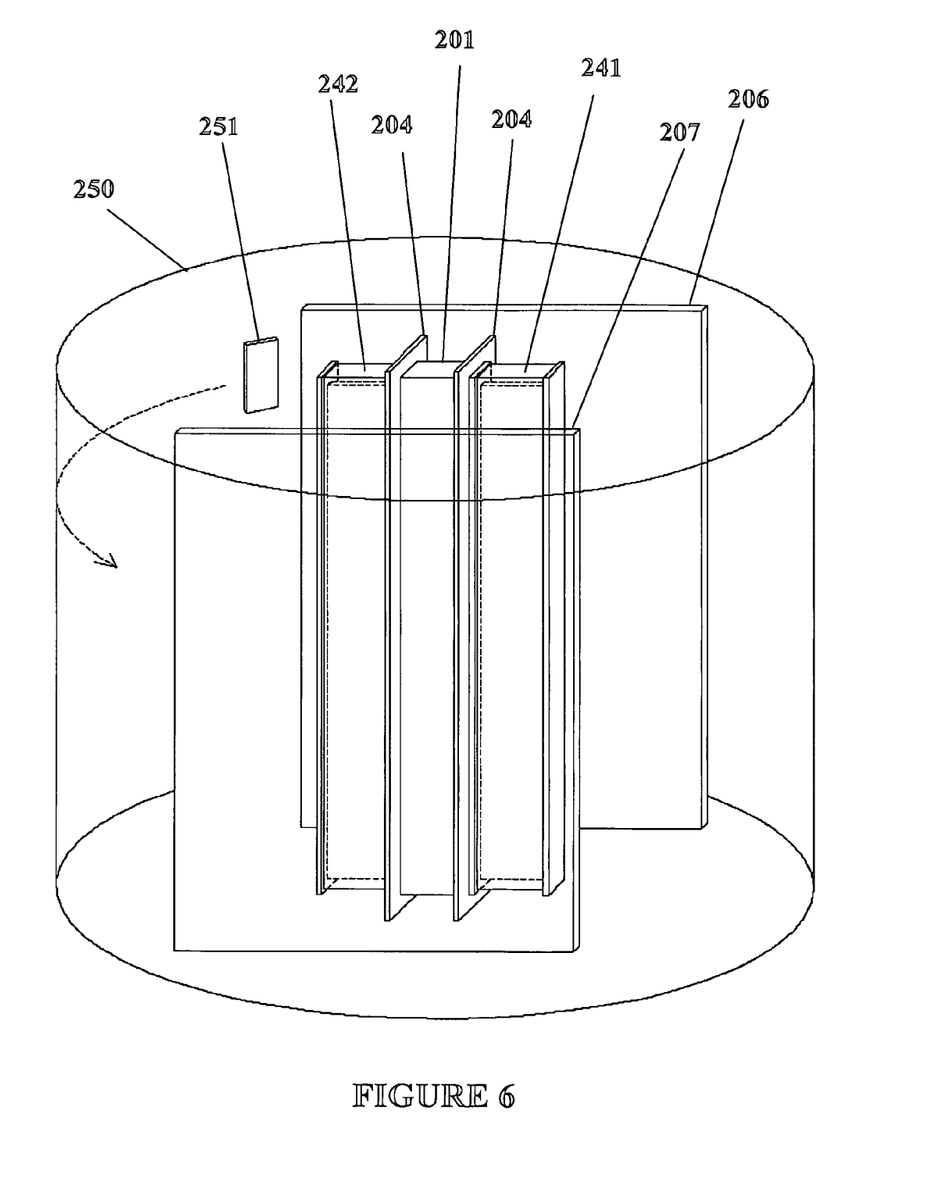
FIG. 6 is a schematic drawing of a bidirectional filtered arc source mounted in the center of a rotating substrate carousel according to an exemplary embodiment.

In FIG. 6, cathode 201 is disposed between deflection electrodes 206 and 207, and between secondary electromagnet coils 241 and 242. The primary magnetic means and cathode cooling means are not shown. Cathode side shields 204 project beyond the evaporable surface on all sides by a distance selected, in conjunction with the width of deflection electrodes 206 and 207, to prevent macroparticles ejected from the evaporable surface from reaching a substrate 251 mounted on the inside surface of rotating cylindrical carousel 250.

The rotation speed of the carousel 250 in FIG. 6 should be high enough that one full rotation occurs during each small increment of arc movement. The deposition rate is therefore constant, on average, around the circumference of the cylinder, while the plasma jet scans up and down along the carousel length as the arc rotates around the cathode periphery. For example, one rotation of the substrate carousel for each 1 cm of arc movement along the cathode requires a carousel rotation speed of approximately 100 rpm, when the arc is rotating at 1 rpm around a cathode 50 cm long.

In reference to all FIGURES, the mounting and cooling of the cathode, anode, and filtering apparatus can be accomplished by any suitable method. Some blockage of plasma flow due to cooling and power connections and mechanical supports is unavoidable; however, the connections may preferably be made at the ends of the cathode, leaving the sides unobstructed along their entire length. The cathode has the general shape of a rectangular bar, but may comprise multiple segments or replaceable elements for convenience in operation and maintenance. The arc may be prevented from moving laterally off the edge of the evaporable surface by known means, e.g. insulators, shields, conductive rings, or permeable rings.

Those reviewing this disclosure will recognize that the various exemplary embodiments disclosed herein with respect to FIGS. 3-6 include various advantageous features in contrast to those utilized in conventional filtered arc systems. For example, according to an exemplary embodiment, a filtered arc source such as that disclosed herein includes a bi-directional output distribution, uses a linear magnetron cathode, and includes a unique arrangement of deflection electrodes, substrate mounting areas, and permanent magnet arrangement.

One particularly advantageous feature disclosed herein is the use of a secondary magnetic means to control the magnetic field in the region of the cathode surface. In this manner, a compact and efficient rectangular plasma source of any required length may be produced. The bi-directional output is well suited for a central source inside a rotating array of substrates, for example, or between two linear conveyors carrying substrates.

The primary and secondary magnetic means may comprise electromagnets, permanent magnets, or a combination of both. A simple solenoid coil wound around the outside of the deflection electrodes and cathode, as shown in FIG. 1, can provide a suitable primary field component. Two or more smaller solenoids may be used in order to shape the magnetic field or for convenience in fabrication and mounting as shown in FIG. 2. According to another exemplary embodiment, the primary field may be generated by means of permanent magnets (e.g., such as those disclosed in the '705 patent). Electromagnets have the advantage that the magnetic field strength can be relatively easily varied, but have the disadvantages of large size and weight, relatively high cost, and the requirement for cooling to prevent heat buildup during operation. Permanent magnets have the advantages of smaller size and lower cost, and require no cooling or power supply, but have the disadvantage that the magnetic field strength can be varied only by replacing the magnets.

The strength of the magnetic field and the deflection electrode bias voltage may be chosen to optimize plasma transmission for a particular material vaporized (atomic weight and average charge state). Magnetic field strengths in the range 100-1000 gauss with electrode bias voltages in the range 5-50 volts are suitable for a variety of materials, although higher and lower field strengths and voltages may be employed according to other exemplary embodiments. The deflection electrode width and spacing and the distance by which the side shield projects can vary within the limits imposed by the line-of-sight requirement. A shorter side shield projection distance requires a wider deflection electrode, and vice versa. Shorter side shields are desirable to maximize the amount of plasma escaping the cathode region and minimize coating buildup on the side shields. Wider deflection shields however occupy more space in the processing chamber, require larger magnetic assemblies, and may suffer increased transmission losses. Water cooling of the deflection electrodes and side shields may be necessary for continuous operation at high power. Bouncing of macroparticles off the deflection electrode can be reduced by means of multiple parallel baffles mounted perpendicular to the electrode as shown in FIG. 2. The height, spacing, number, and location of the baffles may advantageously be selected to ensure that macroparticles cannot escape without making at least two bounces. Alternatively, multiple angled surfaces 148 may be formed in the deflection electrode, as shown in FIG. 3, to control the direction in which incident macroparticles bounce.

According to an exemplary embodiment, an improved apparatus and method are disclosed for generating directed streams of metal plasma, for the purpose of depositing a coating or performing ion processing. The plasma comprises ionized vapor of a cathode material, generated by vacuum arc evaporation using a linear magnetron cathode. The plasma is diverted by deflection electrode means to a substrate region, while macroscopic droplets of cathode material also generated by the arc are intercepted by the deflection electrodes and prevented from reaching the substrate. Improved magnetic means are provided for controlling the arc motion on the cathode surface while simultaneously deflecting and guiding the plasma stream. The source provides a rectangular plasma beam that may be extended indefinitely in length, permitting coating or ion processing of large substrates.

It should be noted that the term "exemplary" as used herein to describe various embodiments is intended to indicate that such embodiments are possible examples, representations, and/or illustrations of possible embodiments of the invention (and such term is not intended to connote that such embodiments are necessarily extraordinary or superlative examples).

It is important to note that the construction and arrangement of the filtered arc source as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present invention as defined in the appended claims. The order or sequence of any process or method steps may be varied or re-sequenced according to alternative embodiments. Other substitutions, modifications, changes and omissions may be made in the design, operating conditions and arrangement of the various exemplary embodiments without departing from the scope of the present inventions as expressed in the appended claims.

What is claimed is:

1. An apparatus for generating plasma comprising:
   a cathode having an evaporable surface configured to emit a material comprising plasma and macroparticles;
   oppositely directed output apertures configured to direct the plasma;
   a filter configured to transmit at least some of the plasma to the output apertures while preventing transmission of at least some of the macroparticles, the filter comprising at least one deflection electrode disposed generally parallel to and facing at least a portion of the evaporable surface;
   a first element for generating a first magnetic field component having a first polarity between the cathode and the at least one deflection electrode; and
   a second element for generating a second magnetic field component having a second polarity at the evaporable surface of the cathode that is opposite that of the first polarity such that a low-field region is created between the evaporable surface and the at least one deflection electrode.

2. The apparatus of claim 1, wherein the first magnetic field component includes flux lines that are substantially parallel to the evaporable surface.

3. The apparatus of claim 2, wherein the flux lines are also substantially parallel to a surface of the deflection electrode.

4. The apparatus of claim 1, wherein the first element for generating a first magnetic field comprises a solenoid coil.

5. The apparatus of claim 4, wherein the second element for generating a second magnetic field comprises at least one electromagnetic coil.

6. The apparatus of claim 1, wherein at least one of the first element and the second element comprise a permanent magnet.

7. The apparatus of claim 1, wherein at least one of the first element and the second element comprise an electromagnet.

8. The apparatus of claim 1, wherein the cathode has the shape of a rectangular bar having four long sides and two ends and wherein the evaporable surface comprises two opposite long sides and both ends of the bar.

9. The apparatus of claim 8, wherein the at least one deflection electrode comprises at least two deflector surfaces.

10. The apparatus of claim 9, wherein each of the at least two deflector surfaces are mounted parallel to and facing one of the long sides of the evaporable surface.

11. The apparatus of claim 10, wherein the at least one deflection electrode is configured to deflect the plasma into two directions parallel to the at least two deflector surfaces while preventing at least some of the macroparticles from reaching the output apertures.

12. The apparatus of claim 1, wherein the filter further comprises a cathode side shield comprising at least two surfaces mounted on opposite sides of the evaporable surface and projecting outward from the evaporable surface by a selected distance.

13. The apparatus of claim 12, wherein the side shield is configured to prevent at least some of the macroparticles emitted from the evaporable surface from reaching the output apertures.

14. A method for generating plasma comprising ionized vapor of a cathode material comprising:
    providing a filter comprising parallel deflection electrodes and cathode side shields;
    providing a cathode configured to eject plasma and macroparticles within the filter;
    generating a primary magnetic field component between the deflection electrodes that is parallel to the deflection electrodes and to an evaporable surface of the cathode, the primary magnetic field intended to increase the transmission of plasma emitted from the evaporable surface to a region outside the deflection electrodes; and
    generating a secondary magnetic field component proximate the evaporable surface of the cathode having a polarity opposite that of the primary magnetic field component such that a low-field region is created between the evaporable surface and the adjacent deflection electrode on each side.

15. The method of claim 14, wherein the cathode comprises a rectangular bar and the evaporable surface extends around a lengthwise periphery of the bar.

16. The method of claim 14, wherein the side shields project beyond the evaporable surface on all sides by a distance selected in conjunction with the width of the deflection electrodes to prevent macroparticles ejected from the evaporable surface from escaping the region within the filter.

17. The method of claim 14, wherein the step of generating a primary magnetic field component utilizes a solenoid coil.

18. The method of claim 17, wherein the step of generating a secondary magnetic field component utilizes at least one electromagnetic coil.

19. The method of claim 14, wherein at least one of the step of generating a primary magnetic field component and the step of generating a secondary magnetic field component utilizes a permanent magnet.

20. The method of claim 14, further comprising providing two oppositely directed output apertures for directing the plasma.

21. The method of claim 14, wherein at least one of the step of generating a primary magnetic field component and the step of generating a secondary magnetic field component utilizes a electromagnet.

22. An apparatus for generating plasma comprising:
    a cathode configured to emit plasma and macroparticles;
    output apertures for directing the plasma in two different directions;
    a filter configured to transmit at least a portion of the plasma while preventing transmission of at least a portion of the macroparticles, the filter comprising at least one deflection electrode;
    a first source for generating a first magnetic field component between the cathode and the at least one deflection electrode, the first magnetic field component having a first polarity; and a second source for generating a second magnetic field component having a second polarity that is opposite that of the first polarity, the second source provided proximate the cathode.

23. The apparatus of claim 22, wherein the output apertures comprise a first output aperture and a second output aperture, the first output aperture directing plasma in a first direction and the second output aperture directing plasma in a second direction substantially opposite the first direction.

24. The apparatus of claim 22, wherein the first source comprises a solenoid coil.

25. The apparatus of claim 22, wherein the second source comprises at least one electromagnetic coil.

26. The apparatus of claim 22, wherein at least one of first source and the second source comprises a permanent magnet.

27. The apparatus of claim 22, wherein at least one of first source and the second source comprises an electromagnet.

28. The apparatus of claim 22, wherein the first source and the second source are configured to create a first magnetic field component near the at least one deflection electrode and a second magnetic field component near the cathode, the first magnetic field component having a strength greater than that of the second magnetic field component.

29. The apparatus of claim 22, wherein the first source and the second source are configured to form a low-field region between the cathode and the at least one deflection electrode.

30. The apparatus of claim 22, wherein the cathode is a rectangular bar having four long sides and two ends.

31. The apparatus of claim 22, wherein the at least one deflection electrode comprises at least two deflection electrodes.

32. The apparatus of claim 22, wherein the at least one deflection electrode comprises at least two baffles that extend toward the cathode.

33. The apparatus of claim 32, wherein the at least one deflection electrode is configured to deflect the plasma into two directions parallel to the at least two baffles.

34. The apparatus of claim 22, wherein the at least one deflection electrode is configured to prevent at least some of the macroparticles from reaching the output apertures.

35. The apparatus of claim 22, wherein the filter further comprises a cathode side shield comprising at least two surfaces mounted on opposite sides of the cathode and projecting outward from the cathode by a selected distance, the side shield configured to prevent at least some of the macroparticles emitted from the cathode from reaching the output apertures.

* * * * *